(12) United States Patent  
Matheson

(10) Patent No.: US 6,944,514 B1  
(45) Date of Patent: Sep. 13, 2005

(54) INNOVATION INFORMATION MANAGEMENT MODEL

(75) Inventor: Dan Matheson, Fort Collins, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 379 days.

(21) Appl. No.: 09/680,751

(22) Filed: Oct. 6, 2000

(51) Int. Cl.$^7$ ............................................. G06F 19/00
(52) U.S. Cl. .......................... 700/98; 700/182; 703/1.2
(58) Field of Search ........................... 700/182, 97, 98, 700/181; 703/1, 23

(56) References Cited

U.S. PATENT DOCUMENTS

| | | | |
|---|---|---|---|
| 5,109,337 A | | 4/1992 | Ferriter et al. |
| 5,355,317 A | | 10/1994 | Talbott et al. |
| 5,646,862 A | * | 7/1997 | Jolliffe et al. ................... 703/1 |
| 5,754,738 A | | 5/1998 | Saucedo et al. |
| 5,822,206 A | * | 10/1998 | Sebastian et al. ............. 700/97 |
| 6,445,974 B1 | * | 9/2002 | Malaugh et al. ............ 700/182 |

OTHER PUBLICATIONS

Spur/Krause: Das virtuelle Produkt; Hanser, 1997, pp. 48-51.
W. Ahrens: Produktdatentechnologie: STEP für die Produktsleittechnik?! (part 2); atp 39 (1997) 7, 1997, pp. 40-48.

* cited by examiner

Primary Examiner—Kidest Bahta

(57) ABSTRACT

An Innovation Information Management data tracking object model and interface which captures and stores product ideas, requirements, constraints, design alternatives and functions, along with their associated relationships, in an object model database is presented. Each object model includes information and relationships that are accessible via a publicly defined interface. In one embodiment, when an object model is saved to the object model database, the information objects making up the Innovation Information Management object model, along with their relationships to other objects, are saved in separate relational database files. Because the different innovation information is separated and stored in a tool neutral persistent form, any application can access the information contained in those objects.

21 Claims, 8 Drawing Sheets

410

| Description 501 | Name 502 |
|---|---|
|  |  |
|  |  |
|  |  |
|  |  |
|  |  |
|  |  |

| Product Idea Name 601 | Description 602 | Name 603 | ID 604 | Priority 605 | Weight 606 |
|---|---|---|---|---|---|
|  |  |  |  |  |  |
|  |  |  |  |  |  |
|  |  |  |  |  |  |
|  |  |  |  |  |  |

| Product Idea Name 701 | Description 702 | Name 703 | Status 704 | Status Reason 705 | History 706 |
|---|---|---|---|---|---|
|  |  |  |  |  |  |
|  |  |  |  |  |  |
|  |  |  |  |  |  |
|  |  |  |  |  |  |

| Product Requirement ID | Design Alternative Name | Description | Name | is_relevant_for | |
|---|---|---|---|---|---|
| 601 | 602 | 603 | 604 | 605 | 606 |
| | | | | | |
| | | | | | |
| | | | | | |
| | | | | | |

| Product Function Name | Percent |
|---|---|
| 901 | 902 |
| | |
| | |
| | |
| | |
| | |
| | |

FIG. 9

INNOVATION INFORMATION MANAGEMENT MODEL

FIELD OF THE INVENTION

The present invention pertains generally to information management, and more particularly to a system and method for capturing, storing, and accessing information used during the innovation of a product in a tool neutral persistent form.

BACKGROUND OF THE INVENTION

Product development is assisted by computer based applications, including word processing and graphics tools, scheduling tools, and product data management tools, among others. The typical product development cycle begins with an idea for a product or an improvement to a product that addresses a need in the industry or provides a solution to a problem. From the product idea, alternative designs may be explored, and ultimately, a design is chosen, designed, and implemented. During the initial phases of the product development cycle, word processing, graphics, and scheduling tools are often used to capture information such as marketing analyses, projected development schedules, and descriptions and reasonings behind particular design choices. During the design phase, information related to the design, such as the design specifications and 3-D model data, are typically captured using a CAD tool. During production of the product, part tracking information is typically captured using a Product Data Management (PDM) tool. As an example, suppose a designer has an idea for a new product. Along with the idea, the designer is aware of several requirements that the product must fulfill and has a couple of solution ideas. The designer must use several different tools to create representations of various parts of the solution. For example, the designer uses Microsoft Excel to create a cost analysis, Corel for graphic illustration, SolidDesigner for an initial space budget, and CoCreate's WorkManager to create an initial functional organization.

While it is clear that various computer-based tools assist in capturing information and tracking the progress of a product, the current state of the art remains problematic. First, no tool currently exists for specifically capturing and tracking the ideas and decisions about those ideas during the initial phases of the product development. Exploration of ideas is often a situation where much trial and error, and resulting correction, is seen. In order to successfully track such exploration, it is necessary to capture many only partially completed information structures, the decisions to continue or abandon a path of exploration, and the rationale behind these decisions. It is also useful to capture the intent of a particular solution alternative. In the prior art, no single tool exists for capturing and tracking such important information including the intentions and objects of a design, questions, ideas, and answers posed during the exploration of the design, and the same information with respect to alternative designs that are explored. Furthermore, even if some of the information is captured using one or more different tools, because the information is not integrated or easily accessible except using the particular tool that captured the information, much of the initial design intents and design decision rationales, as well as the design alternatives that were explored, is typically not effectively captured, or is lost as the development cycle of the product progresses.

In addition, in the current state of the art, all design-related information that is captured using a particular-computer-based tool, is typically stored, owned, and retrieved only via the tool used to create the data. There are many reasons why it would be advantageous to have the ability to access the data created by one tool using different tools. In particular, the information captured using one tool may be useful to various people from various entities performing various roles. For example, certain information captured during the design of a product may be useful not only to the design engineers, but to the manufacturing and testing engineers, managers of the product generation process, service technicians, marketing and sales personnel, order processing personnel, web site designers and administrators, customers, and suppliers, to name a few.

Accordingly, a need exists for a way to capture, store, and retrieve innovation information including product ideas, alternative designs, questions and answers explored during the innovation process, design decisions, etc. A need also exists for capturing the innovation information in a tool neutral form that allows any tool to access (and modify where appropriate) the innovation information. Such a tool would allow one to track the gradual development of the design and decisions about the design over the evolution of the product, thereby capturing and allowing tracking of the functional "as-designed" aspects of a product rather than at most the "as-built" configurations of the end product that the prior tools tend to capture.

SUMMARY OF THE INVENTION

The present invention is a system and method for capturing, storing, and accessing innovation information data in a tool neutral persistent form which allows access to the data by any tool via a publicly defined interface. The invention captures the clear incremental build-up of innovation information including product ideas, alternative designs, questions and answers explored during the innovation process, design decisions, etc. The innovation information is represented in a form that may be accessed and presented in different ways using various computer-based applications.

The invention captures the evolutionary buildup of information relating to the initial idea and exploration of a product over time. During the exploration of a product, many alternatives are suggested and investigated. Decisions are made which prune away possibilities. As the design progresses the questions asked and the associated answers change as global decisions are made and more detailed questions are revealed. Parts of the product definition move from Idea to Complete Definition at different rates. The innovation information object model of the invention assists in tracking the functional "as-designed" aspects of the product. The "as-designed" tracking thus provides a time spectrum from exploring product ideas to the complete and released-for-production product definition. The information gradually develops and evolves, becoming more detailed as the design process executes. The possibility for innovation never stops as long as questions remain open where creative answers are needed. The impact of innovation moves from global to local as decisions are made and the detail levels are addressed.

The present invention preferably includes an Innovation Information Management object model which captures and stores various object models containing articles of information and their associated relationships in an object model database. Each object model includes information and relationships that are accessible via a publicly defined interface. In one embodiment, when an object model is saved to the object model database, various types of articles of information contained in the object model, along with their relationships to other articles of information, are saved in separate relational database files associated with the articles of information. Applications accessing the object model database merely use the defined object model interface, which results in the automatic separation and storage of data type objects in a tool neutral persistent form.

The invention facilitates access to information by any application via the defined object model interfaces, without regard to which application created the objects. Thus, there is no "ownership" of the data by any application, including the tool that created the data.

The invention also facilitates sophisticated queries on the object models to extract interesting information from the totality of stored information. The invention is advantageous for many reasons, including the ability for multiple people with different roles to access and extract the information in ways that are meaningful to their role.

BRIEF DESCRIPTION OF THE DRAWINGS

The invention will be better understood from a reading of the following detailed description taken in conjunction with the drawing in which like reference designators are used to designate like elements, and in which:

FIG. 5 is an illustrative example of a relational database file implementing a Product Idea table in accordance with the invention;

FIG. 6 is an illustrative example of a relational database file implementing a Product Requirement table in accordance with the invention;

FIG. 7 is an illustrative example of a relational database file implementing a Design Alternative table in accordance with the invention;

FIG. 8 is an illustrative example of a relational database file implementing a Product Function table in accordance with the invention;

FIG. 9 is an illustrative example of a relational database file implementing a Requirement Fulfillment table in accordance with the invention;

DETAILED DESCRIPTION

Figure 1:
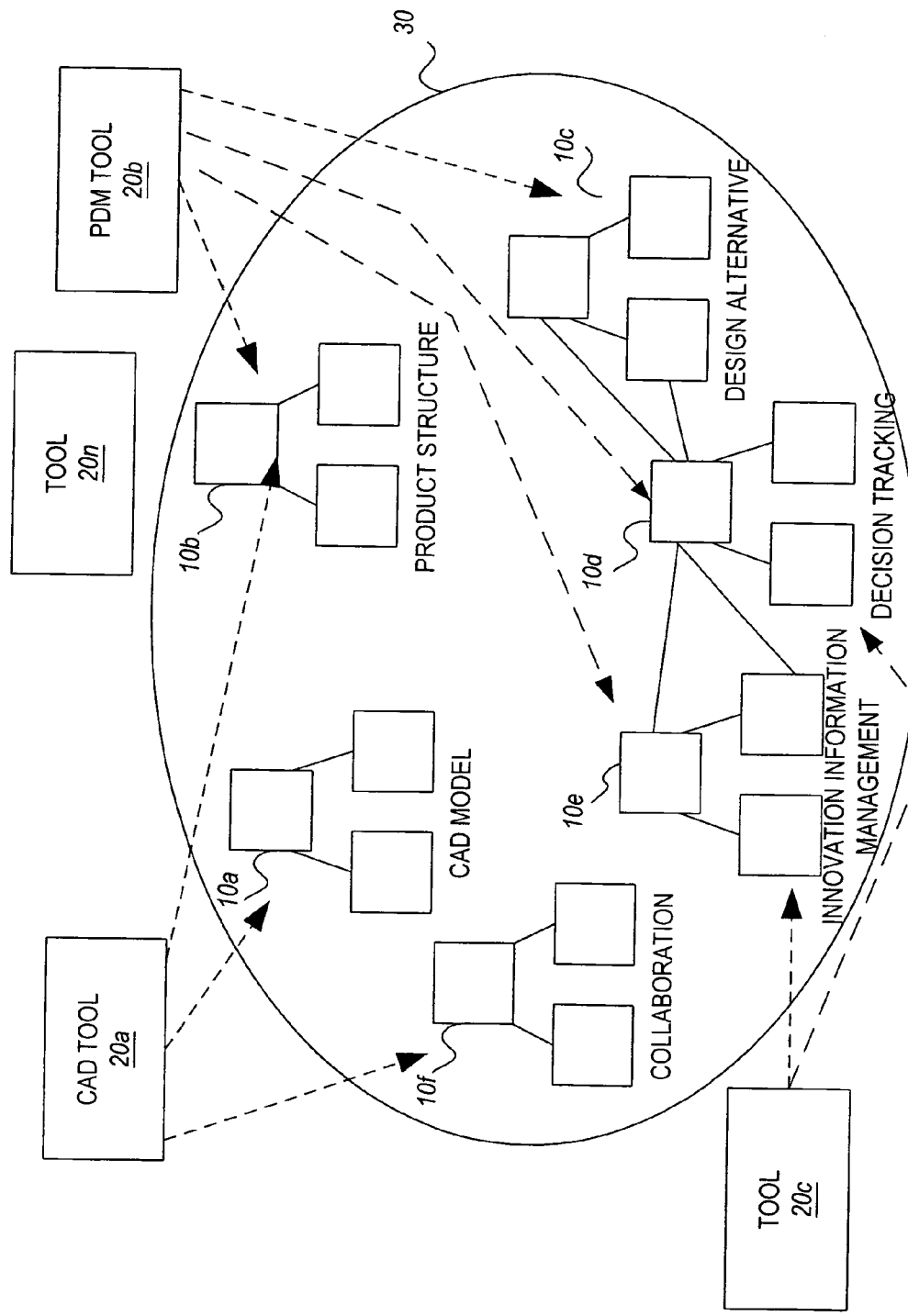
FIG. 1 is a conceptual object model diagram illustrating the separation of articles of information and their associated relationships to other articles of information.

FIG. 1 is a conceptual block diagram illustrating the separation of articles of information and their associated relationships to other articles of information, illustrating the accessibility of the information by various tools. In particular, a collection of object models $10a$, $10b$, $10c$, $10d$, $10e$, and $10f$, describing information and object relationships created by a variety of different tools $20a$, $20b$, $20c$, ..., $20n$ during the development of a product are stored in a tool neutral form in persistent storage 30. Importantly, the object models $10a$, $10b$, $10c$, $10d$, $10e$, and $10f$ are not owned by any tool, including the tools $20a$, $20b$, $20c$, ..., $20n$ that created them. Each object model $10a$, $10b$, $10c$, $10d$, $10e$, and $10f$ contains objects that have highly dependent object relationships.

The object models $10a$, $10b$, $10c$, $10d$, $10e$, and $10f$ each have a defined public interface that allows any tool $20a$, $20b$, $20c$, ..., $20n$ that understands the interface definition to read and write legal data to the corresponding set of objects. Although it may be that only one application tool completely understands a single attribute (i.e., a CAD tool that understands a 3D geometry and topology), the public interface definition allows virtually any tool to access parts of the object that is does understand, including its relationships with other objects. For example, the CAD tool $20a$ (e.g., SolidDesigner) creates data that is stored partly in the CAD Model object model $10a$ and partly in the Product Structure object model $10b$. It is important to note that the CAD tool $20a$ is not required to change its internal data structure or user interface; rather the CAD tool $20a$ need only have capability to understand only those objects and structure that it reads and writes (which may be accomplished using an extension that allows import/export capability, techniques of which are well-known in the art). In this example, a Product Data Management (PDM) tool $20b$ (e.g., CoCreate Software, Inc.'s WorkManager) accesses the Product Structure model $10b$ and Design Alternative model $10c$. Accordingly, the PDM tool $20b$ must have capability for handling changes made to the Product Structure model $10b$ made by the CAD tool $20a$, and likewise, the CAD tool $20a$ must have the capability of handling changes made to the Product Structure model $10b$ by the PDM tool $20b$. The common object model (i.e., Product Structure model $10b$) that they understand thereby enhances the collaboration between the CAD tool $20a$ and PDM tool $20b$.

It is also important to note that other tools (e.g., $20n$) can also access the object models $10a$, $10b$, $10c$, $10d$, $10e$, and $10f$ at any time, and the collection of object models $10a$, $10b$, $10c$, $10d$, $10e$, and $10f$, can be expanded at any time. Accordingly, the collection of information and relationships with other objects expands and evolves over the course of the product cycle, capturing the "as-designed" aspects of the product. In addition, the tool neutral persistent form of the object models allow both synchronous and asynchronous collaboration of the product development by allowing many different people (e.g., engineers, management, administrative personnel, and even customers) with appropriate permissions to access the data contained in the object models, which represents the current state of the product.

Among the object models in the object model database 30 is an Innovation Information Management object model $10e$, which encapsulates all of the innovation information associated with the development of a product, including product ideas, alternative designs, questions and answers explored during the innovation process, design decisions, etc., and their relationships both to other objects in the IIM object model $10e$ and to objects in other object models $10a$, $10b$, $10c$, $10d$, and $10f$.

Objects in the IIM object model $10e$ may be created automatically by one or more tools $20a$, $20b$, $20c$, ... $20n$, or may be specifically created by users via IIM-specific dialogs accessed via the user interface of the tools. In addition, an Innovation Information Management tool 20c may be developed for specifically entering innovative information data. However, as noted above, no tool has ownership of the data in the IIM object model 10e, and any tool can access the data in the IIM object model 10e via publicly defined interfaces (discussed hereinafter) associated with the IIM object model 10e.

Figure 2:
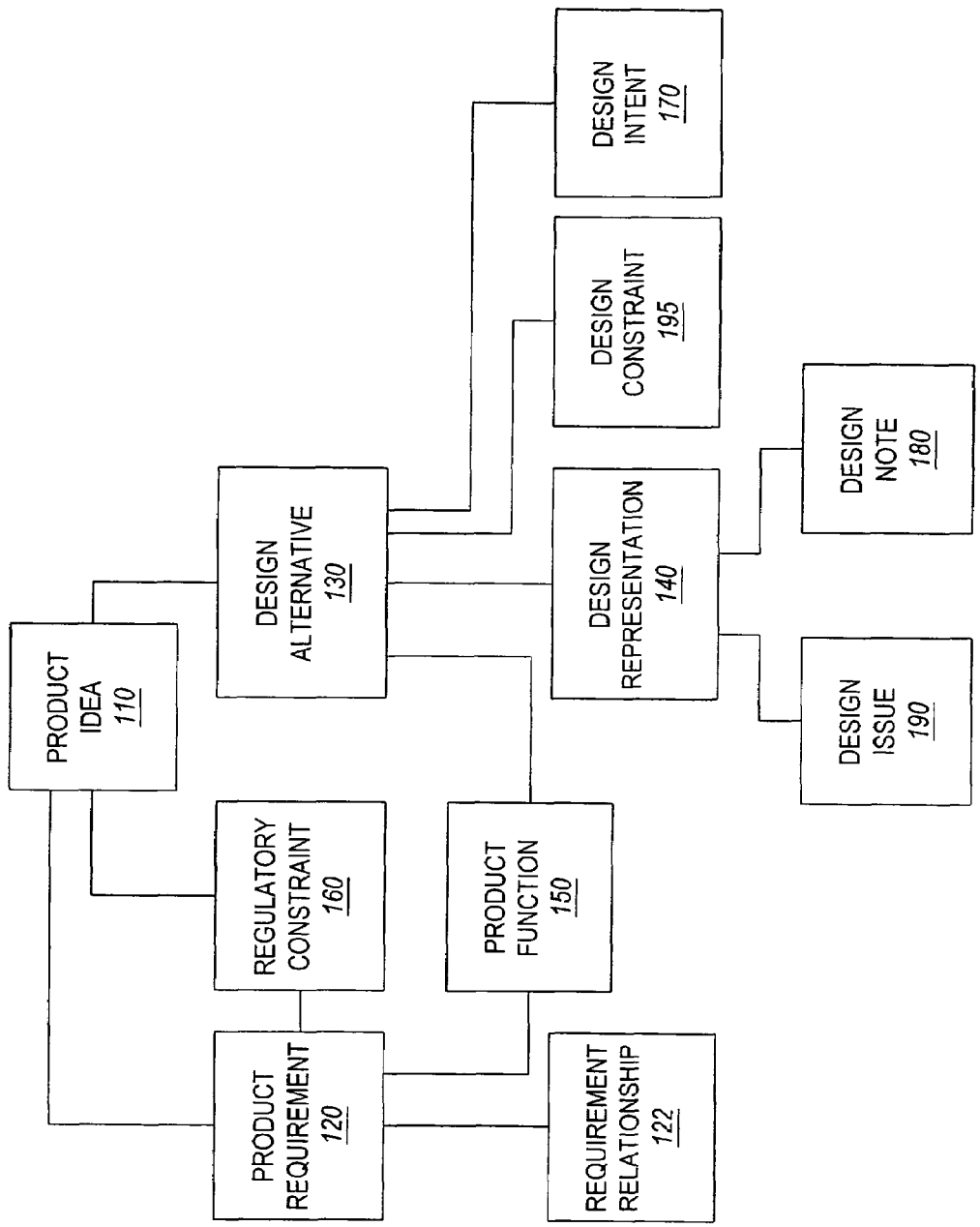
FIG. 2 is a block diagram of an Innovation Information Management object model implemented in accordance with the invention.

FIG. 2 is a block diagram illustrating a preferred embodiment 100 of the Innovation Information Management object model 10e of FIG. 1, which provides an object model for capturing and storing the pieces and structure of information developed during the exploration phase of a product's development in a tool neutral persistent form.

As illustrated in FIG. 2, the major articles of information in the IIM object model 100 include the objects: Product Idea 110, Product Requirement 120, Design Alternative 130, Design Representation 140, Product Function 150, Regulatory Constraint 160, Design Intent 170, Design Note 180, Design Issue 190, and Design Constraint 195.

A Product Idea 110 article of information (or object) encapsulates an idea about a product. A Product Idea may be an idea for a new product, an enhancement or improvement to an existing product, or the solution to a known problem (such as an Engineering Change) for an existing product.

A Product Requirement 120 object encapsulates a requirement that the product must or should or could fulfill. For any given product, there will typically be many requirements from many different sources (e.g., marketing, customers, engineering, manufacturing).

A Design Alternative 130 object encapsulates information representing a possible solution or design for an idea encapsulated in a Product Idea object 110. A Design Representation 140 object encapsulates one way of modeling the proposed solution or design represented in a Design Alternative object 130.

A Product Function 150 object encapsulates a function for solving a Product Requirement.

A Regulatory Constraint object encapsulates a constraint that is placed on the product that is outside the control of the designers. For example, the communication bands defined by the FCC would be a regulatory constraint for communication products.

A Design Intent object encapsulates a specific intent or objective of the design. A Design Note object encapsulates a note related to the design. A Design Issue object is associated with a Design Representation. The issue encapsulated in a Design Issue object represents a concern or open question raised after viewing this representation of the Design Alternative. A Design Constraint object encapsulates a constraint, of which the organization has some control over, that the Design Alternative must meet.

Within the IIM object model 100, there exist relationships between the data objects, as illustrated by the connecting lines between the objects. For example, each Product Idea 110 may have associated with it various Product Requirements 120 (as defined by the designers and others having input into the design), which may each have zero or more associated Product Function objects 150 which fulfill (or partially fulfill) the requirement encapsulated in its associated Product Requirement object 120. Each Product Idea 110 may also have associated with it various Regulatory Constraints 160 (as defined by the industry, for example), which may then be represented by an associated Product Requirement 120, as described previously. Each Product Idea 110 may also have associated with it various Design Alternative objects 130, which may have associated Design Intent objects 170 and associated Product Function objects 150. In addition, each Design Alternative may have associated Design Constraints 195 and/or associated Design Representations 140. Each Design Representation 140 may have associated Design Notes 180 and/or Design Issues 190.

Figure 3:
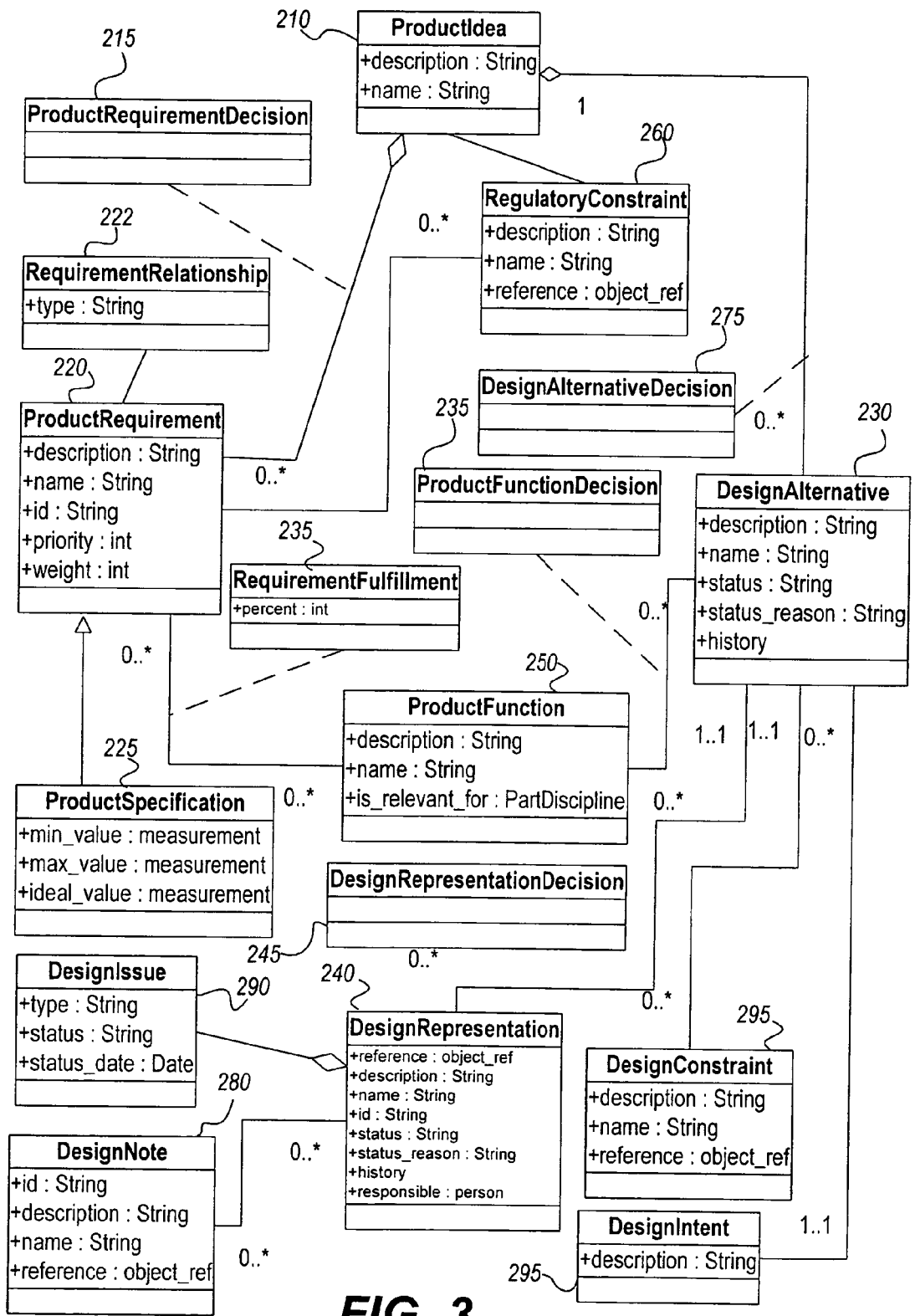
FIG. 3 is a UML interface diagram illustrating a preferred embodiment of the IIM object model interface for the IIM object model shown in FIG. 2.

FIG. 3 is a UML interface diagram illustrating a preferred embodiment of the IIM object model interface for the IIM object model 100 of FIG. 2. As illustrated in FIG. 3, the public interfaces defined for the IIM object model 200 of FIG. 2 include: ProductIdea 210, ProductRequirement 220, DesignAlternative 230, DesignRepresentation 240, ProductFunction 250, RegulatoryConstraint 260, DesignIntent 270, DesignNote 280, DesignIssue 290, DesignConstraint 295, and ProductSpecification 125. The attributes for each interface are as displayed in FIG. 3. In the IIM interface definition, information about each product idea is encapsulated in a Product Idea object 110 (FIG. 2) accessed using the ProductIdea 210 interface. In this embodiment, the ProductIdea interface 210 has zero or more RegulatoryConstraint interfaces 260, each of which may have zero or more associated ProductRequirement interfaces 220. The ProductIdea interface 210 may also have an association with zero or more ProductRequirement interfaces 220, which may come from various sources and may have an attached relationship defined via a RequirementRelationship interface 222. A ProductSpecification interface 225 is an extension of the ProductRequirement interface 220, and is used to more specifically define specifications to the requirements. Each ProductRequirement interface 220 may have associated with it zero or more ProductFunction interfaces 250, which provides a solution to fulfilling, or partially fulfilling, a Product Requirement. The ProductFunction interface 250 is defined in the standardized Object Management Group (OMG) PDM Enablers PDMConfigurationManagement interface, which is known in the art and described in detail in "PDM Enablers: Joint Proposal to the OMG in Response to OMG Manufacturing Domain Task Force RFP 1", Paper mfg/98-02-02 of the Object Management Group (OMG). The PdmConfigurationManagement interface extends the product structure enabler to support enterprises in which a product may be offered for sale in many different configurations of components. The configuration management module enables specification of product classes and differentiating product configurations. Accordingly, the IIM object model of the invention is compatible with the standardized PDM Enabler interfaces.

As also illustrated, the ProductIdea interface 210 may be associated with zero or more DesignAlternative interfaces 230, which provide access to zero or more Design Alternative objects 130 associated with a particular Product Idea object 110. Each DesignAlternative interface 230 has zero or more DesignConstraint interfaces 295 and zero or more DesignRepresentation interfaces 240, which respectively provide access to an associated DesignConstraint object 195 and/or an associated Design Representation object 140. Each DesignRepresentation interface 240 is associated with 0 or more DesignNote interfaces 280, which provides access to a Design Note object 180, and zero or more DesignIssue interfaces 290, which provides access to a Design Issue object 190.

A RequirementFulfillment interface 255 provides a way to access the level of fulfillment of the product requirement that the product function meets. This allows one to later query the IIM object model to test for those design alternatives that fulfill certain requirements, which may be prioritized to determine which design alternative most closely fulfills the highest priority requirements.

This ability to query the system asking important questions, and automatically receiving the feedback from the IIM object model is a very powerful aspect provided by the invention.

A set of decision-making interfaces allow a user to capture and track various decisions made during the exploration phase of the product. For example, a ProductRequirementDecision interface 215 allows the tracking of questions, answers, and resulting decisions related to the product requirements. A ProductFunctionDecision interface 235 allows the tracking of questions, answers, and resulting decisions related to use of proposed product function solutions in a particular design alternative. A DesignAlternativeDecision interface 275 allows the tracking of questions, answers, and resulting decisions related to the choices of design alternatives. A DesignRepresentationDecision interface 245 allows the tracking of questions, answers, and resulting decisions related to the choices made in implementation of a particular design alternative.

The interfaces defined in the UML diagram of FIG. 3 are preferably implemented in an object-oriented language such as C++ or Java2. The actual class implementation may vary from system to system, since it will often make sense to combine some of the interfaces into a single class for efficiency of implementation and/or performance.

Figure 4:
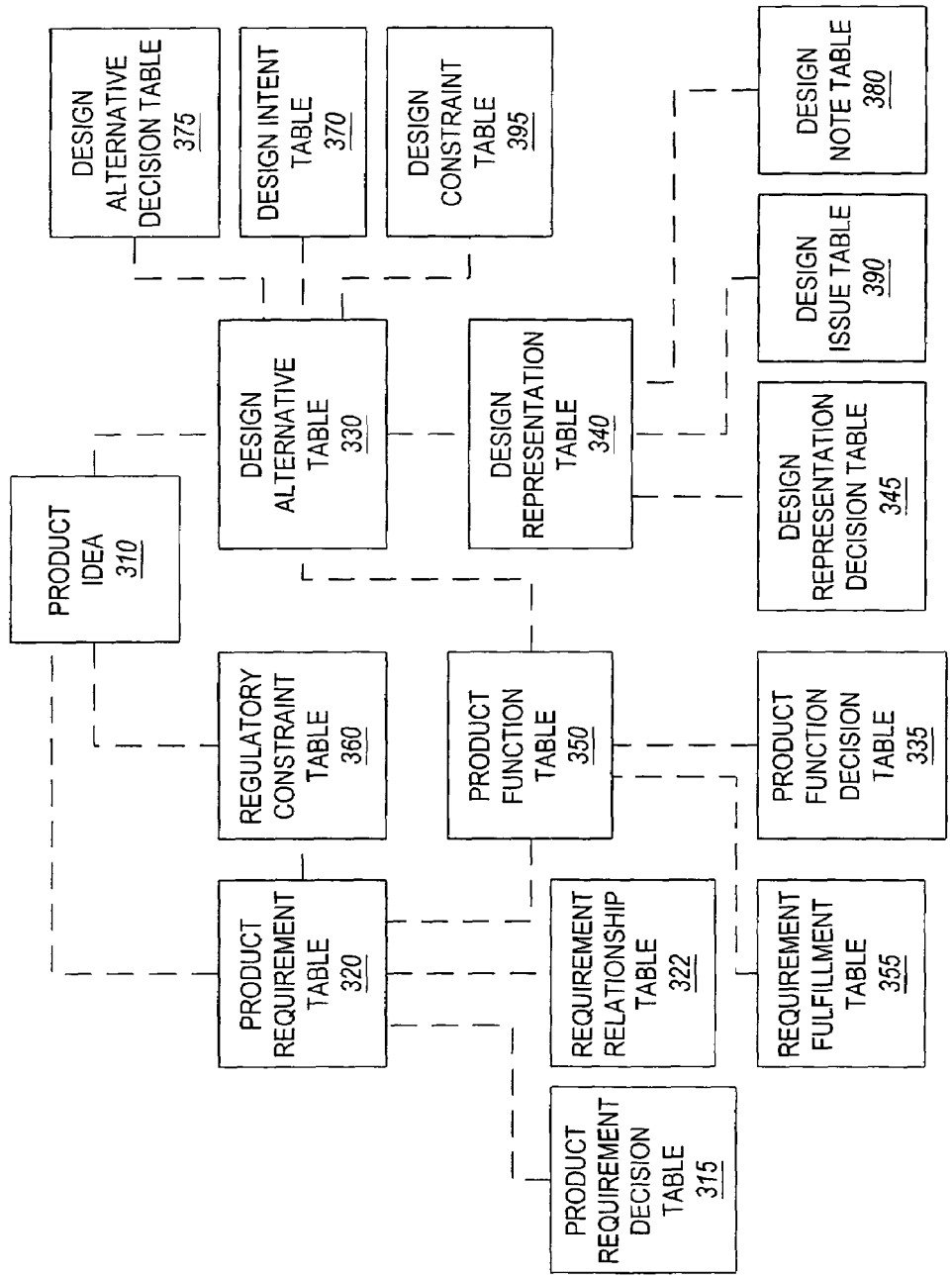
FIG. 4 is a block diagram of the persistent storage entities generated and maintained by the IIM object model of FIG. 2 using the interfaces defined in FIG. 3.

FIG. 4 is a block diagram illustrating one embodiment of the persistent storage entities generated and maintained by the IIM object model 100 of FIG. 2 using the interfaces defined in FIG. 3. In this embodiment, each of the interfaces has associated with it a persistent storage file, preferably in the form of a relational database. The data encapsulated using each respective interface is stored in its respective relational database file. Accordingly, there is a separate relational database file for each defined interface. In the illustrative embodiment, a Product Idea table 310 stores all data available using the ProductIdea interface 210, Product Requirement table 320 stores all data accessed using the ProductRequirement interface 220, Design Alternatives table 330 stores all data accessed using the DesignAlternative interface 230, Design Representation table 340 stores all data accessed using the DesignRepresentation interface 240, Product Function table 350 stores all data accessed using the ProductFunction interface 250, Regulatory Constraints table 360 stores all data accessed using the RegulatoryConstraints interface 260, Design Intent table 370 stores all data accessed using the DesignIntent interface 270, Design Note table 380 stores all data accessed using the DesignNote interface 280, Design Issue table 390 stores all data accessed using the Design Issue interface 290. In addition, decision tables Product Requirement Decision table 315, Product Function Decision table 335, Design Representation Decision table 345, and Design Alternative Decision table 375 each respectively store all data accessed using the interfaces ProductRequirementDecision 215, ProductFunctionDecision 235, DesignRepresentationDecision 245, and DesignAlternativeDecision 275. A Requirement Fulfillment table 355 stores the data accessed using he RequirementFulfillment interface 255. The dashed lines connecting the various tables represents a foreign key (i.e., a common column in each connected relational database) used to represent relationships between data stored in the tables.

FIG. 5 is an illustrative example of a relational database file 410 implementing a Product Idea table 310. As illustrated, each column 501, 502, maps to an attribute encapsulated by the ProductIdea interface 210 and each row maps to a different Product Idea object 110.

FIG. 6 is an illustrative example of a relational database file 420 implementing a Product Requirement table 320. Again, each column 602, 603, 604, 605, and 606 respectively maps to an attribute encapsulated by the ProductRequirement interface 220 and each row maps to a different Product Requirement object 120. In this example, the primary key (i.e., a unique identifier across the file) for each Product Requirement object 120 is its Product Requirement ID (in this embodiment stored in column 603). The Product Idea name attribute of the Product Idea object to which the Product Requirement object 120 is associated is used as the foreign key; accordingly a foreign key column 601 is provided to map respective Product Requirement objects to their associated Product Idea objects.

FIG. 7 is an illustrative example of a relational database file 430 implementing a Design Alternative table 330. In this example, the Product Idea name attribute of the Product Idea object to which the Design Alternative object 130 is associated is used as the foreign key; accordingly a foreign key column 701 is provided to map respective Design Alternative objects to their associated Product Idea objects.

FIG. 8 is an illustrative example of a relational database file 450 implementing a Product Function table 350. In this example, the Product Requirement ID attribute of the Product Requirement object to which the Product Function object 150 is associated is used as one foreign key and the Design Alternative name attribute of the Design Alternative object to which the Product Function object 150 is associated is used as another foreign key; accordingly a respective foreign key columns 801 and 802 are provided to map Product Function objects 150 to their associated respective Product Requirement objects 120 and Design Alternative objects 130.

FIG. 9 is an illustrative example of a relational database file 455 implementing a Requirement Fulfillment table 355. As illustrated, column 902 maps to the percent attribute encapsulated via the RequirementFulfillment interface 255 and each row maps to a different ProductFunction object 106. In this example, the Product Function name attribute of the Product Function object 150 is used as the foreign key; accordingly a foreign key column 901 is provided to map a Requirement Fulfillment object to its associated Product Function object 150.

The other tables illustrated in FIG. 4 are implemented in relational databases files similar to those illustrated in FIGS. 5–9.

Figure 10:
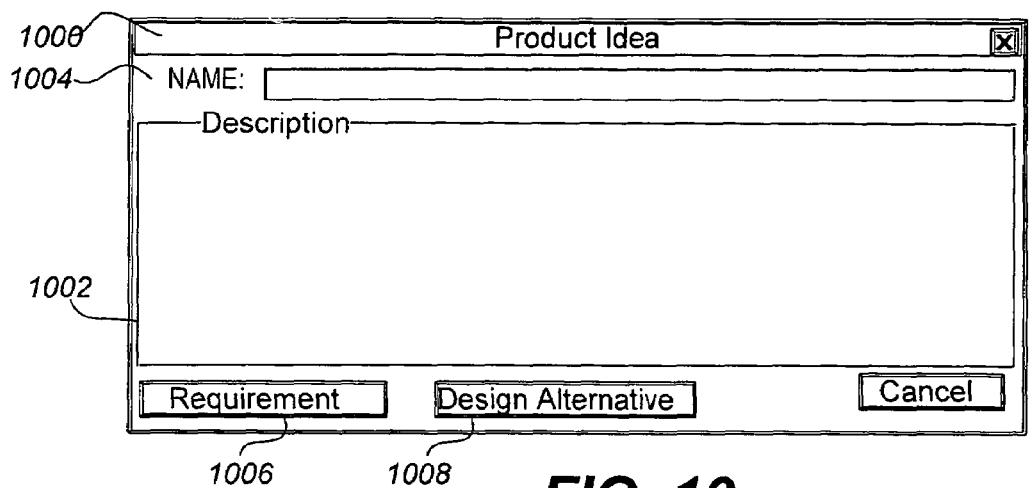
FIG. 10 is a Product Idea dialog for a graphical user interface implemented in accordance with the invention.
Figure 11:
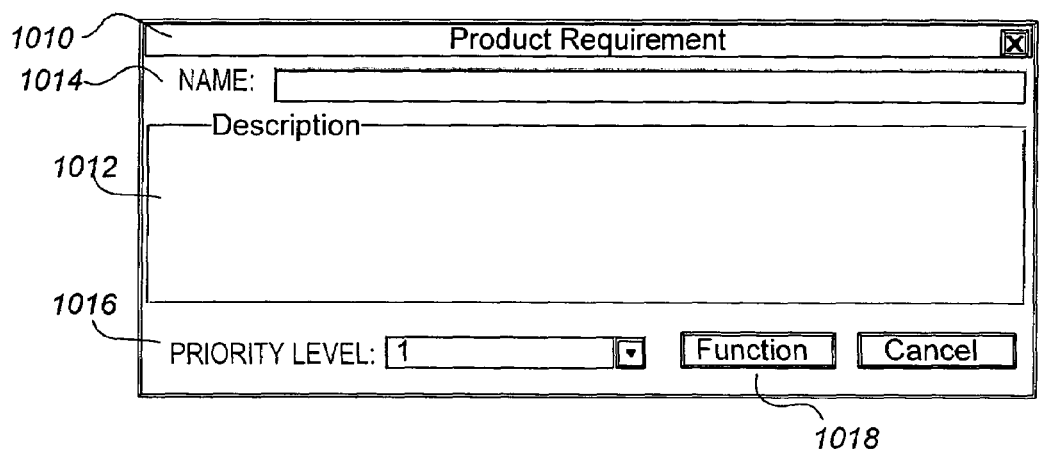
FIG. 11 is a Product Requirement dialog for a graphical user interface implemented in accordance with the invention.

The methods by which certain IIM data is captured varies according to the type of data captured. Data may be captured when a user manually enters the data via a user interface dialog (for example, when a user enters a Product Idea and associated proposed Design Alternatives, Product Requirements, and/or Product Functions using a Product Idea dialog in the application's user interface), or may be created automatically by an application (for example, attributes such as object identifiers, Creation Time or Last Modified Date may be automatically created or captured by the application at the time an article of information is captured or modified). FIG. 10 is an example Product Idea dialog 1000 of a graphical user interface for a generic application that has the capability for accessing and creating an IIM object model 10e in accordance with the invention. As illustrated, the Product Idea dialog 1000 includes user capabilities to enter a description 1002 of a product idea and a name 1004 for the product idea. The Product Idea dialog 1000 also includes user capabilities (i.e., buttons 1006 and 1008) for entering proposed Product Requirements and Design Alternatives for the Product Idea. In particular, if the user clicks on the Product Requirement button 1006, a Product Requirement dialog 1010, illustrated in FIG. 11, pops up. As illustrated in FIG. 11, the Product Requirement dialog 1010 allows the user to enter a description 1012 of the product requirement, a name 1014 for the product requirement, and a priority 1016 assigned to the product requirement.

Figure 12:
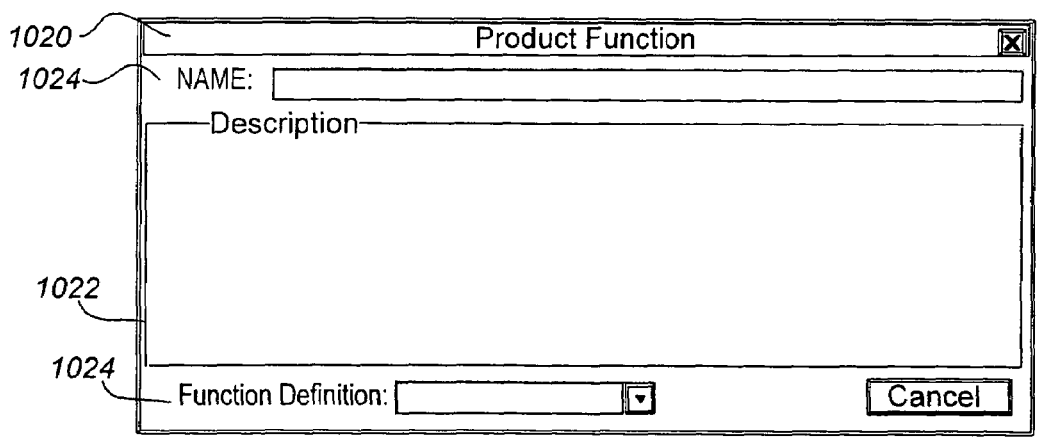
FIG. 12 is a Product Function dialog for a graphical user interface implemented in accordance with the invention.

User capability for entering one or more proposed Product Functions to fulfill or partially fulfill the product requirement may be accessed by clicking on a Function button 1018, which pops up a Product Function dialog 1020, illustrated in FIG. 12. As illustrated in FIG. 12, the user may fill in the description 1022 and name 1024 of the function, and optionally attach a defined part (known by the system) to the function object which allows the application to automatically generate a Requirement Fulfillment object 255 which indicates how well the Product Function fulfills the Product Requirement.

Figure 13:
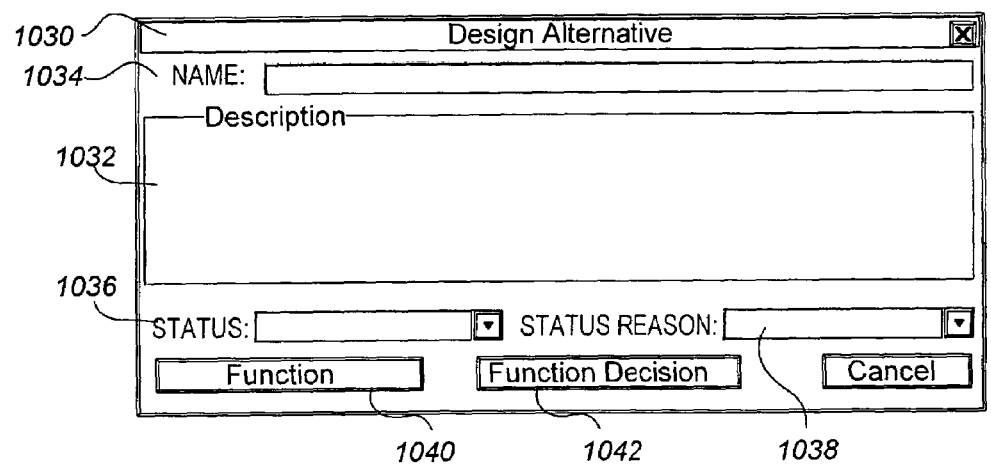
FIG. 13 is a Design Alternative dialog for a graphical user interface implemented in accordance with the invention.

FIG. 13 is an example Design Alternative dialog 1030, which may be reached from the Product Idea dialog 1000 by clicking on the Design Alternative button 1008. As illustrated, the Design Alternative dialog 1030 allows a user to enter a description 1032, a name 1034, a status 1036, and a reason 1038 for the status 1036. The Design Alternative dialog 1030 may also include a Product Function button 1040 that takes the user to the Product Function dialog 1020 of FIG. 12 and a Product Function Decision button 1042 that pops up a dialog (not shown) to allow the user to enter a decision about each Product Function associated with the Design Alternative.

As described in detail above, the invention provides a novel way of capturing, storing and accessing Innovation Information Management data, including incremental buildup of innovation information including product ideas, alternative designs, questions and answers explored during the innovation process, design decisions, etc. The innovation information is represented in a form that may be accessed and presented in different ways using various computer-based applications.

The invention captures the evolutionary buildup of information relating to the initial idea and exploration of a product over time. During the exploration of a product, many alternatives are suggested and investigated. Decisions are made which prune away possibilities. As the design progresses, the questions asked and the associated answers change as global decisions are made and more detailed questions are revealed. Parts of the product definition move from Idea to Complete Definition at different rates. The innovation information object model of the invention assists in tracking the functional "as-designed" aspects of the product. The "as-designed" tracking thus provides a time spectrum from exploring product ideas to the complete and released-for-production product definition. The information gradually develops and evolves, becoming more detailed as the design process executes. The possibility for innovation never stops as long as questions remain open where creative answers are needed. The impact of innovation moves from global to local as decisions are made and the detail levels are addressed.

The invention facilitates access to information by any application via the defined object model interfaces, without regard to which application created the objects. Thus, there is no "ownership" of the data by any application, including the tool that created the data.

The invention also facilitates sophisticated queries on the object models to extract interesting information from the totality of stored information. The invention is advantageous for many reasons, including the ability for multiple people with different roles to access and extract the information in ways that are meaningful to their role.

It will be appreciated from a reading of the above detailed description that the invention affords several advantages over the prior art. The IIM object model of the invention increases the efficiency of understanding of how and why a product design is in its current configuration. Accordingly, the IIM object model of the invention allows the capture and tracking of the functional "as-designed" aspects of the product rather than the "as-built" configurations of the end product, thereby providing a time spectrum from the initial exploration of product ideas to the complete and released-for-production product definition. The information gradually develops and evolves, becoming more detailed as the design process executes.

Although the invention has been described in terms of the illustrative embodiments, it will be appreciated by those skilled in the art that various changes and modifications may be made to the illustrative embodiments without departing from the spirit or scope of the invention. It is intended that the scope of the invention not be limited in any way to the illustrative embodiment shown and described but that the invention be limited only by the claims appended hereto.

What is claimed is:

1. A computer system for capturing information related to product innovation-related data, comprising:
   a product idea software interface for capturing an idea for a product in a product idea object;
   a design alternative software interface for capturing a plurality of design alternatives for said product in a plurality of respective design alternative objects;
   a product requirement software interface for capturing requirements for said product idea in product requirement objects; and
   a product fulfillment software interface which captures how well said product function fulfills said product requirements, wherein said product fulfillment software interface further generates responses to queries related to levels of fulfillments of requirements encapsulated in product requirement objects by alternative designs encapsulated in design alternative objects.

2. A computer system in accordance with claim 1, comprising:
   a design representation software interface for capturing a representation of said design alternative in a design representation object.

3. A computer system in accordance with claim 1, comprising:
   a decision software interface for capturing a decision in a product requirement object, said decision relating to one of said product idea or said design alternative.

4. A computer system in accordance with claim 1, wherein:
   each of said product idea object and said design alternative objects are stored in a tool-neutral persistent form.

5. A computer system in accordance with claim 1 comprising:
   each of said product idea object, said design alternative objects, and said product requirement objects are stored in a tool-neutral persistent form.

6. A computer system in accordance with claim 2, comprising:
   each of said product idea object, said design alternative objects, and said design representation objects are stored in a tool-neutral persistent form.

7. A method for capturing information related to product innovation-related data using a computer system, comprising:

capturing an idea for a product in a product idea object by a product idea software interface of said computer system;

capturing a plurality of design alternatives for said product in a plurality of respective design alternative objects by a design alternative software interface of said computer system;

capturing requirements for said product idea in product requirement objects by a requirement fulfillment software interface of said computer system; and generating responses, by said requirement fulfillment software interface, to queries related to levels of fulfillment of requirements encapsulated in product requirement objects by alternative designs encapsulated in said plurality of design alternative objects.

8. A method in accordance with claim 7, comprising:

capturing a function for fulfilling said product requirement in a product function object by a product fulfillment software interface of said computer system.

9. A method in accordance with claim 7, comprising:

capturing a representation of said design alternative in a design representation object by a design alternative software interface of said computer system.

10. A method in accordance with claim 7, comprising:

capturing a decision in a decision object, said decision relating to one of said product idea or said design alternative by a decision software interface.

11. A method in accordance with claim 7, comprising:

storing each of said product idea object and said design alternative objects in a tool-neutral persistent form.

12. A method in accordance with claim 7, comprising:

storing each of said product idea object, said design alternative objects, and said product requirement objects in a tool-neutral persistent form.

13. A method in accordance with claim 9, comprising:

storing each of said product idea object, said design alternative objects, and said design representation objects in a tool-neutral persistent form.

14. A computer system for managing a product design process, the computer system comprising:

a database comprising: (i) a product idea object encapsulating information related to a conception of a product being designed according to said product design process; (ii) product requirement objects encapsulating requirements to be fulfilled by said product; and (iii) design alternative objects encapsulating multiple designs that represent a solution corresponding to said product idea object; and a requirement fulfillment software interface for processing queries related to levels of fulfillment of requirements encapsulated in said product requirement objects by alternative designs encapsulated in said design alternative objects.

15. The computer system of claim 14 wherein said product requirement objects encapsulate priority information and said requirement fulfillment software interface processes said priority information to facilitate said queries.

16. The computer system of claim 14 further comprising:

a product requirement decision software interface for storing and retrieving information associated with decisions related to requirements encapsulated within said product requirement objects.

17. The computer system of claim 14 wherein said database further comprises:

product function objects encapsulating information associated with functionality of design alternative objects corresponding to requirements encapsulated within the product requirement objects.

18. The computer system of claim 17 further comprising:

a product function decision software interface for storing and retrieving information associated with decisions related to functionality selected for said design alternative objects.

19. A computer readable medium containing executable instructions for a computer system, said computer readable medium comprising:

code for a product idea software interface for capturing an idea for a product in a product idea object;

code for a design alternative software interface for capturing a plurality of design alternatives for said product in a plurality of respective design alternative objects;

code for a product requirement software interface for capturing requirements for said product idea in product requirement objects; and code for a product fulfillment software interface which captures how well said product function fulfills said product requirements, wherein said product fulfillment software interface further generates responses to queries related to levels of fulfillments of requirements encapsulated in product requirement objects by alternative designs encapsulated in design alternative objects.

20. A computer readable medium in accordance with claim 19, further comprising:

code for a design representation software interface for capturing a representation of said design alternative in a design representation object.

21. A computer readable medium in accordance with claim 19, further comprising:

code for a decision software interface for capturing a decision in a product requirement object, said decision relating to one of said product idea or said design alternative.

\* \* \* \* \*